United States Patent
Iftime et al.

(10) Patent No.: US 9,374,907 B2
(45) Date of Patent: Jun. 21, 2016

(54) METHOD OF IMPROVING SHEET RESISTIVITY OF PRINTED CONDUCTIVE INKS

(71) Applicant: XEROX CORPORATION, Norwalk, CT (US)

(72) Inventors: Gabriel Iftime, Mississauga (CA); Yiliang Wu, Oakville (CA); Naveen Chopra, Oakville (CA); Cuong Vong, Hamilton (CA); Michael D'Amato, Thornhill (CA); Sandra J. Gardner, Oakville (CA); Kurt I. Halfyard, Mississauga (CA); Adrien P. Côté, Clarkson (CA)

(73) Assignee: XEROX CORPORATION, Norwalk, CT (US)

( * ) Notice: Subject to any disclaimer, the term of this patent is extended or adjusted under 35 U.S.C. 154(b) by 290 days.

(21) Appl. No.: 13/925,438

(22) Filed: Jun. 24, 2013

(65) Prior Publication Data

US 2014/0377454 A1    Dec. 25, 2014

(51) Int. Cl.
*B05D 5/12* (2006.01)
*H05K 3/12* (2006.01)
*B05D 3/02* (2006.01)
*B05D 3/12* (2006.01)
*H05K 1/09* (2006.01)

(52) U.S. Cl.
CPC ............... *H05K 3/1283* (2013.01); *B05D 5/12* (2013.01); *B05D 3/02* (2013.01); *B05D 3/12* (2013.01); *H05K 1/095* (2013.01); *H05K 2201/0129* (2013.01); *H05K 2201/0245* (2013.01); *H05K 2203/1131* (2013.01); *H05K 2203/1545* (2013.01)

(58) Field of Classification Search
USPC ............... 427/98.4, 99.2, 123, 355, 359, 365, 427/366, 375
See application file for complete search history.

(56) References Cited

U.S. PATENT DOCUMENTS

| | | | | |
|---|---|---|---|---|
| 5,376,169 | A  * | 12/1994 | Hotomi | C09D 11/36 106/31.73 |
| 8,911,823 | B2 * | 12/2014 | Li et al. | 427/191 |
| 2008/0169122 | A1 | 7/2008 | Shiraishi et al. | |
| 2008/0206488 | A1* | 8/2008 | Chung | C09D 5/24 427/596 |
| 2008/0246007 | A1* | 10/2008 | Gellrich | 252/500 |
| 2010/0189901 | A1* | 7/2010 | Chung | B22F 9/24 427/256 |

(Continued)

OTHER PUBLICATIONS

"Technical Data Sheet;" *DuPont 5025 Silver Conductor*; 2009; DuPont; http://mcm.dupont.com.

(Continued)

*Primary Examiner* — Brian K Talbot
(74) *Attorney, Agent, or Firm* — Pillsbury Winthrop Shaw Pittman LLP (57) ABSTRACT

A method of forming a printed pattern on a substrate includes printing a pattern onto the substrate with a conductive ink including a conductive material, a thermoplastic binder and a solvent, curing the printed pattern, and fusing the printed pattern by feeding the printed pattern through a fusing system operated at a temperature of about 20° C. to about 130° C. above the glass transition temperature of the thermoplastic binder and at least 120° C. at a minimum, a pressure of from about 50 psi to about 1500 psi, and a feed rate through the fusing system of about 1 m/min to about 100 m/min. The method may be done continuously. The method improves the sheet resistivity of the printed ink.

17 Claims, 2 Drawing Sheets

(56) References Cited

U.S. PATENT DOCUMENTS

| | | | |
|---|---|---|---|
| 2010/0231672 A1* | 9/2010 | Joyce | B41F 23/00 347/102 |
| 2012/0043512 A1* | 2/2012 | Liu | B41M 3/006 252/519.21 |
| 2013/0112261 A1* | 5/2013 | Lixin et al. | 136/256 |
| 2013/0142963 A1 | 6/2013 | Kirk et al. | |
| 2013/0146820 A1* | 6/2013 | Chiou | H01B 1/22 252/511 |
| 2014/0126113 A1* | 5/2014 | Ogiwara | 361/523 |

OTHER PUBLICATIONS

U.S. Appl. No. 13/925,506, filed Jun. 24, 2013, in the name of Chopra et al.

U.S. Appl. No. 13/925,352, filed Jun. 24, 2013 in the name of Chopra et al.

* cited by examiner

METHOD OF IMPROVING SHEET RESISTIVITY OF PRINTED CONDUCTIVE INKS

BACKGROUND

The current total market value for silver inks is estimated to be approximately $8 billion annually. A current main use for silver inks is for printing conductive lines and interconnects between electric parts in devices. Devices utilizing silver inks include, for example, home appliances, such as in control panels of the home appliances, for example for flat membrane sensors and switches, consumer electronics, computers, cell phones and solar panels.

Fabrication of electronic elements using liquid deposition techniques is of profound interest as such techniques provide potentially low-cost alternatives in applications such as thin film transistors (TFTs), light-emitting diodes (LEDs), RFID tags, photovoltaics, and the like. However the deposition and/or patterning of functional electrodes, pixel pads, and conductive traces, lines and tracks which meet the conductivity, processing, and cost requirements for practical applications have been a great challenge.

While the market for silver paste is well established in the above-mentioned applications, there are great opportunities if problems with silver ink were solved, such as low conductivity or high sheet resistance when compared with pure metals, and cost, in view of the rising cost of silver.

Thus, a performance concern with most commercially available conductive inks, for example conductive inks comprised of a conductive flake such as silver, binder and solvent, is that the conductivity is too low when compared with pure metal. For commercial silver ink pastes from suppliers such as DuPont or Henkel, a sheet resistivity of the inks ranges from 12 to 25 mΩ/sq./mil.

Conductive inks with a reduced sheet resistance would be a great enabler for the use of the inks in a wide range of products requiring exceptional conductive interconnections between electronic components, such as sensors, photovoltaic panels, flat OLED lighting and so on. Furthermore, conductive inks with increased conductivity may allow for the printing of thinner lines, therefore reducing materials costs.

There thus remains a need for conductive inks exhibiting improved sheet resistivity and conductivity.

SUMMARY

The above and other issues are addressed by the present application, wherein in embodiments, the application relates to a method of forming a printed pattern on a substrate, comprising printing a pattern onto the substrate with a conductive ink comprised of a conductive material, a thermoplastic binder and a solvent, curing the printed, and fusing the printed pattern by feeding the substrate with the printed pattern thereon through a fusing system operated at a temperature of about 20° C. to about 130° C. above the glass transition temperature of the thermoplastic binder and at least 120° C. at a minimum, a pressure of from about 50 psi to about 1500 psi, and a feed rate through the fusing system of about 1 m/min to about 100 m/min.

Also described herein is a method of forming a printed pattern on a substrate, comprising printing a pattern onto the substrate with a conductive ink comprised of a conductive material, a thermoplastic binder and a solvent, curing the printed pattern, and fusing the printed pattern by feeding the substrate with the printed pattern thereon through a fusing system operated at a temperature of about 20° C. to about 130° C. above a glass transition temperature of the thermoplastic binder and at least 120° C. at a minimum, a pressure of from about 50 psi to about 1500 psi, and a feed rate through the fusing system of about 1 m/min to about 100 m/min, wherein the fused printed pattern has a sheet resistivity of 10 mΩ/sq./mil or less.

Further described is a continuous method of forming a printed pattern on a substrate, comprising in a continuous manner, feeding a substrate through a printing apparatus for printing a pattern onto the substrate with a conductive ink, a curing apparatus for curing the printed pattern and a fusing apparatus for fusing the cured printed pattern, wherein the printing comprises printing a pattern onto the substrate, the conductive ink comprising a conductive material, a thermoplastic binder and a solvent, and the fusing comprises fusing the printed pattern by feeding the substrate with the printed pattern thereon through a fusing system operated at a temperature of about 20° C. to about 130° C. above the glass transition temperature of the thermoplastic binder and at least 120° C. at a minimum, a pressure of from about 50 psi to about 1500 psi, and wherein a feed rate through the continuous method is about 1 m/min to about 100 m/min.

EMBODIMENTS

In this specification and the claims that follow, singular forms such as "a," "an," and "the" include plural forms unless the content clearly dictates otherwise. All ranges disclosed herein include, unless specifically indicated, all endpoints and intermediate values. In addition, reference may be made to a number of terms that shall be defined as follows:

"Optional" or "optionally" refer, for example, to instances in which subsequently described circumstances may or may not occur, and include instances in which the circumstance occurs and instances in which the circumstance does not occur.

The phrases "one or more" and "at least one" refer, for example, to instances in which one of the subsequently described circumstances occurs, and to instances in which more than one of the subsequently described circumstances occurs.

The modifier "about" used in connection with a quantity is inclusive of the stated value and has the meaning dictated by the context (for example, it includes at least the degree of error associated with the measurement of the particular quantity). When used in the context of a range, the modifier "about" should also be considered as disclosing the range defined by the absolute values of the two endpoints. For example, the range "from about 2 to about 4" also discloses the range "from 2 to 4."

Described herein is a print process that achieves printed conductive inks with improved sheet resistivity and conductivity, as compared to the same printed conductive inks printed via conventional processes.

In a conventional printing process, a conductive ink is printed, generally via screen printing, to form a desired pattern of the conductive ink upon a substrate. Following the printing of the conductive ink, the printed portion is subjected to a drying or curing process to remove solvent from the ink and solidify the ink upon the substrate. In the present process, it has been found that if the above cured ink is further subjected to an additional fusing step, the sheet resistivity is surprisingly lowered, and the conductivity of the printed ink surprisingly increased, compared to conventional printed inks.

The process herein thus comprises printing a pattern onto a substrate with a conductive ink by a printing process, subjecting the printed pattern of ink to curing, for example at a temperature of from about 120° C. to about 250° C., and for a time sufficient to remove substantially all solvent from the conductive ink, and subjecting the pattern of ink to fusing by feeding the printed pattern through a fusing system operated at a temperature of about 20° C. to about 130° C. above a glass transition temperature (Tg) of a thermoplastic binder of the conductive ink, but at least 120° C. at a minimum, a pressure of from about 50 psi to about 1500 psi, and a feed rate there through of about 1 m/min to about 100 m/min.

As the conductive ink to use in the processes herein, any suitable conductive ink may be used. The conductive ink desirably includes at least a conductive material, a thermoplastic binder and a solvent.

As the conductive material, any material in particulate form may be used, wherein the particle has an average size of from, for example, 0.5 to 15 microns, such as 1 to 10 microns or 2 to 10 microns. While the particle may be of any shape, desirably the conductive material is of a two dimensional shape, such as a flake shape, including rods, cones and plates, or needle shape, and having, for example, an aspect ratio of at least about 3 to 1, such as at least about 5 to 1.

The conductive material may be comprised of any conductive metal or metal alloy material. Suitable conductive materials may include, for example, metals such as at least one selected from gold, silver, nickel, indium, zinc, titanium, copper, chromium, tantalum, tungsten, platinum, palladium, iron, cobalt, and alloys thereof. A combination comprising at least one of the foregoing can be used. The conductive material may also be a base material coated or plated with one or more of the foregoing metals or alloys, for example silver plated copper flakes. For cost, availability and performance reasons, desirable conductive materials comprise silver or silver plated materials.

The conductive material may be present in the conductive paste in an amount of from, for example, about 50 to about 95 weight percent of the ink, such as about 60 to about 90 weight percent or about 70 to about 90 weight percent.

The ink also includes at least one thermoplastic binder. The binder is desirably a material that possesses a reasonably high viscosity to allow the ink to retain the pattern following printing with a Tg that allows the thermoplastic material to be melted or softened, and shear thinned, at reasonable temperatures (lower Tg being desirable for this aspect) yet also allows for the printed ink to be robust (requiring a higher Tg). The binder may have a weight average molecular weight (Mw), as measured by any accepted methodology, of from 10,000 to 600,000 Daltons (Da), such as from about 25,000 to about 250,000 Da or from about 30,000 to about 250,000 Da. The Tg of the binder is from, for example, 55° C. to about 150° C., such as from about 60° C. to about 100° C. or from about 60° C. to about 80° C.

The at least one thermoplastic binder may be any suitable material. Example thermoplastic binder polymers include, for example, polyesters such as terephthalates, terpenes, styrene block copolymers such as styrene-butadiene-styrene copolymer, styrene-isoprene-styrene copolymer, styrene-ethylene/butylene-styrene copolymer, and styrene-ethylene/propylene copolymer, ethylene-vinyl acetate copolymers, ethylene-vinyl acetate-maleic anhydride terpolymers, ethylene butyl acrylate copolymer, ethylene-acrylic acid copolymer, polymethylmethacrylate, polyethylmethacrylate, and other poly(alkyl)methacrylates, polyolefins, polybutene, polyamides, and the like and mixtures thereof.

The at least one thermoplastic binder may optionally include functional groups such as hydroxyl group or carboxyl groups, that may assist in the dispersion of the binder in the solvent of the ink and/or the dispersion of the conductive material in the ink.

In embodiments, the binder is a polyvinylbutyral (PVB) terpolymer having the following formula:

wherein $R_1$ is a chemical bond, such as a covalent chemical bond, or a divalent hydrocarbon linkage having from about 1 to about 20 carbons, from about 1 to about 15 carbon atoms, from about 4 to about 12 carbon atoms, from about 1 to about 10 carbon atoms, from about 1 to about 8 carbon atoms or from about 1 to about 4 carbon atoms; $R_2$ and $R_3$ are independently an alkyl group, such as a methyl, ethyl, propyl, butyl, pentyl, hexyl and heptyl groups, an aromatic group or a substituted aromatic group having from about 1 to about 20 carbon atoms, from about 1 to about 15 carbon atoms, from about 4 to about 12 carbon atoms, from about 1 to about 10 carbon atoms, from about 1 to about 8 carbon atoms or from about 1 to about 4 carbon atoms; x, y and z represent the proportion of the corresponding repeat units respectively expressed as a weight percent, wherein each repeat unit is randomly distributed along polymer chain, and the sum of x, y and z is about 100 weight percent; x is independently from about 3 weight percent to about 50 weight percent, from about 5 weight percent to about 40 weight percent, from about 5 weight percent to about 25 weight percent and from about 5 weight percent to about 15 weight percent; y is independently from about 50 weight percent to about 95 weight percent, from about 60 weight percent to about 95 weight percent, from about 75 weight percent to about 95 weight percent and from about 80 weight percent to about 85 weight percent; z is independently from about 0.1 weight percent to about 15 weight percent, from about 0.1 weight percent to about 10 weight percent, from about 0.1 weight percent to about 5 weight percent and from about 0.1 weight percent to about 3 weight percent.

The polyvinylbutyral terpolymer may be derived from a vinyl butyral, a vinyl alcohol and a vinyl acetate, and has a weight average molecular weight (Mw) of about 10,000 to about 600,000 Da, such as from about 40,000 to about 300,000 Da or from about 40,000 to about 250,000 Da. The Tg of the PVB terpolymer binder is from, for example, about 60° C. to about 100° C., such as from about 60° C. to about 85° C. or from about 62° C. to about 78° C. A representative composition of the polyvinylbutyral terpolymer constitutes, on a weight basis, about 10 to about 25% hydroxyl groups, calculated as polyvinyl alcohol, about 0.1 to about 2.5% acetate groups calculated as polyvinyl acetate, with the balance being vinyl butyral groups.

In embodiments, the PVB terpolymer has $R_1$ being a bond and x represents the amount of vinyl alcohol units in the terpolymer, $R_2$ being a 3 carbon atom alkyl group and y represents the amount of vinyl butyral units in the terpolymer, and $R_3$ being a 1 carbon atom alkyl group and z represents the amount of vinyl acetate units in the copolymer. The PVB terpolymer is a random terpolymer.

The properties of the PVB terpolymer may be adjusted by adjusting the content of the different units making up the terpolymer. For example, by including a greater amount of vinyl acetate units and a lesser amount of vinyl butyral units (less y and more z) can yield a more hydrophobic polymer with higher heat distortion temperature, making it tougher and better adhesive. Also, including lower amounts of vinyl alcohol (hydroxyl) units may broaden the solubility properties.

Examples of polyvinylbutyral terpolymers include, for example, polymers manufactured under the trade name MOWITAL (Kuraray America), S-LEC (Sekisui Chemical Company), BUTVAR (Solutia), and PIOLOFORM (Wacker Chemical Company). The PVB terpolymer may be prepared as discussed in U.S. Patent Application Publication No. 2012/0043512, incorporated herein by reference in its entirety.

In further embodiments, the binder of the ink may include the PVB terpolymer discussed above, and also include polyvinylpyrrolidone (PVP) polymer. The PVP may have a weight average molecular weight (Mw) of from, for example, about 5,000 to about 80,000, such as about 40,000 to about 70,000. Commercial sources for PVP include Aldrich and ISP Corp. (K-30, with a Mw of about 60,000). The glass transition temperature of the PVP may be from, for example, 125° C. to 180° C., such as from about 150° C. to about 170° C.

The PVP, when used with PVB, is added in an amount of from, for example, about 0.1 to about 3 weight percent of the ink composition, such as from about 0.1 to about 1.5 weight percent or from about 0.2 to about 0.8 weight percent. The weight ratio of PVP to PVB is, for example, from about 1:3 to about 1:30, for example from about 1:3 to about 1:25 or from about 1:5 to about 1:20. At a ratio including more PVP than a ratio of PVP to PVB of 1:3, the ink tends to not have a shear thinning profile suitable for application, which is a profile indicating a reduced viscosity upon shear thinning but rapid viscosity recovery following removal of shear thinning forces.

The inclusion of the PVP allows the ratio of overall polymer binder to conductive material to be reduced, and allows the viscosity profile of the ink to be tuned, offering a compromise between shear thinning behavior (better flow during application) and reduced resistivity.

As to the PVB terpolymer and the PVP, the material and amounts of each to use in the binder depends upon the printing procedure used to apply the ink to a substrate. For screen printing, where viscosity recovery is needed following application to the substrate, a weight ratio of PVP to PVB in the range of, for example, about 1:3 to about 1:30, achieves an ink with this property, along with an ink (including the conductive material therein) having a viscosity in the range of from, for example, about 10,000 to about 70,000 cps. For gravure printing, an ink with little to no PVB may be appropriate, because the viscosity recovery property is not required, and lower viscosity inks may be used, for example having a viscosity of 50 to 2,000 cps. For lithographic and flexographic printing, higher viscosities, for example of 50,000 cps or more, are required, and thus little to no PVP should be included in the ink.

The binder of the conductive ink may be present in an amount of less than about 10 weight percent of the ink, such as for example from about 0.1 to about 8 weight percent, or from about 0.5 to about 5 weight percent, of the ink.

The binder may be made to have a different Mw and Tg in order to assist in imparting a different viscosity to the ink. Different liquid deposition techniques, for example such as screen printing, offset printing, gravure/flexographic printing and the like, require the use of inks having different viscosity requirements, as discussed above. The viscosity may be measured by a variety of methods, but herein is reported as measured with an Ares G2 (TA Instruments). In addition, use of more binder in the ink, and/or less solvent, may act to increase the viscosity of the ink.

The ink also includes at least one solvent. Any solvent capable of dissolving the polymer binder of the ink may be used. The solvent may be a single solvent or a mixture of solvents that dissolve the thermoplastic binder and that can evaporate following printing while being dried under mild drying conditions such as, for example, about 50° C. to about 250° C. The solvent may be an ester-based solvent, ketone-based solvent, glycol ether-based solvent, aliphatic solvent, aromatic solvent, alcohol-based solvent, ether-based solvent, water and the like, depending on the type of substrate on which the ink is to be applied, the printing method used to print the ink, and the like. Example solvents include, for example, water, n-heptane, n-hexane, cyclohexane, methyl cyclohexane and ethyl cyclohexane, toluene, xylene, methanol, ethanol, n-propyl alcohol, isopropyl alcohol, n-butyl alcohol, isobutyl alcohol, sec-butyl alcohol, t-butyl alcohol, cyclohexanol, 3-methoxybutanol, diacetone alcohol, butyl glycol, diols such as ethylene glycol, propylene glycol, diethylene glycol, triethylene glycol and hexylene glycol, ether alcohols such as butoxyethanol, propoxypropanol and butyldiglycol, ethers such as ethylene glycol di-C1-C6-alkyl ethers, propylene glycol di-C1-C6-alkyl ethers, diethylene glycol di-C1-C6-alkyl ethers, such as butyl carbitol (diethylene glycol monobutyl ether), and dipropylene glycol di-C1-C6-alkyl ethers, tetrahydrofuran, ketones such as acetone, methyl ethyl ketone, methyl propyl ketone, methyl isobutyl ketone, methyl amyl ketone, methyl isoamyl ketone, diethyl ketone, diisobutyl ketone, cyclohexanone, isophorone, 2,4-pentanedione and methoxy hexanone, esters or ether esters such as ethyl ethoxypropionate, methyl glycol acetate, ethyl glycol acetate, butyl glycol acetate, butyl diglycol acetate, methoxypropyl acetate, ethoxypropyl acetate, methoxybutyl acetate, methyl acetate, ethyl acetate, propyl acetate, butyl acetate, isobutyl acetate, pentyl acetate, hexyl acetate, heptyl acetate, ethylhexyl acetate, methyl propionate, ethyl propionate, propyl propionate, butyl propionate, pentyl propionate, butyl butyrate, diethyl malonate, dimethyl adipate, dimethyl glutarate, dimethyl succinate, ethylene glycol diacetate, propylene glycol diacetate, dibutyl phthalate and dibutyl sebacate, terpenes such as α- or β-terpineol, hydrocarbons like kerosene, or any combination thereof.

The solvent may be used in an amount of from about 5 to 50 weight percent of the ink, such as from about 5 to about 35 weight percent or from about 5 to about 25 weight percent. The type and amount of solvent or solvents can be adjusted to optimize printing with the ink for the particular printing method, apparatus speed, and the like.

The conductive inks may contain optional additives such as, for example, a plasticizer, a lubricant, a dispersant, a leveling agent, a defoaming agent, an antistatic agent, an antioxidant and a chelating agent as necessary or desired.

The conductive inks may be made by any suitable method. One example method is to first dissolve the binder(s) in the solvent(s) of the ink, which may be done with the accompanying use of heat and/or stirring. The conductive material may then be added, desirably at a gradual rate of addition to avoid lumping. Heat and/or stirring may again be applied during the addition of the conductive material.

The conductive inks are used to form conductive features on a substrate by printing. The printing may be carried out by depositing the ink on a substrate using any suitable printing technique. The printing of the ink on the substrate can occur either on a substrate or on a substrate already containing layered material, for example, a semiconductor layer and/or an insulating layer.

Printing herein refers to, for example, deposition of the ink composition on the substrate. Printing can also include any coating technique capable of forming the ink into a desired pattern on the substrate. Examples of suitable techniques include, for example, spin coating, blade coating, rod coating, dip coating, lithography or offset printing, gravure, flexography, screen printing, stencil printing, stamping (such as microcontact printing), and the like.

The substrate upon which the conductive ink is deposited may be any suitable substrate, including, for example, silicon, glass plate, plastic film, sheet, fabric, or paper. For structurally flexible devices, plastic substrates, such as for example polyester, polycarbonate, polyimide sheets and the like may be used.

Following printing, the patterned deposited ink is subjected to a curing step. The curing step is a step in which substantially all of the solvent of the ink is removed and the ink is firmly adhered to the substrate. Curing herein does not require a crosslinking or other transformation of the binder, although if a crosslinkable binder is used in the ink it may be crosslinked during the curing step if desired. The curing step is done by subjecting the deposited patterned ink to a temperature of, for example, about 50° C. to about 250° C., such as from about 80° C. to about 220° C. or from about 100° C. to about 210° C. When the curing step is completed, the solvent is essentially evaporated. By removal of substantially all of the solvent is meant that >90% of the solvent is removed from the system. The ink film that remains is essentially only conductive material and binder. The print is not damaged by touching, or in other words is free of tack. The ink film should not offset or transfer onto a different substrate by touching when maintained at a temperature below the Tg of the binder. The length of time for curing may vary, as understood by practitioners in the art, based upon the amount of solvent in the ink, the viscosity of the ink, the method used to form the printed pattern, the temperature used for curing, and the like. For screen printing, the curing may take from, for example, about 5 to about 120 minutes. For offset printing, the curing may take from, for example, 20 seconds to 2 minutes. For gravure and flexographic printing, the curing may take from, for example, 20 seconds to 2 minutes. Longer or shorter times may be used, as necessary.

The heating for curing can be performed in air, in an inert atmosphere, for example, under nitrogen or argon, or in a reducing atmosphere, for example, under nitrogen containing from 1 to about 20 percent by volume hydrogen. The heating can also be performed under normal atmospheric pressure or at a reduced pressure of, for example, from about 1000 mbars to about 0.01 mbars.

As used herein, "heating" encompasses any technique(s) that can impart sufficient energy to the patterned ink to cure the ink. Examples of heating techniques may include thermal heating, infra-red ("IR") radiation, a laser beam, flash light, microwave radiation, or UV radiation, or a combination thereof.

In the fusing step, the cured patterned ink is subjected to a temperature of 20° C. to 130° C. above the Tg of the binder(s) of the ink, such as 20° C. to 100° C. or 30° C. to 80° C. above the Tg of the binder(s). The fusing should subject the patterned ink to a temperature of at least 120° C., for example to a temperature of at least about 130° C. or at least about 140° C. The fusing temperature is achieved via heating such as discussed above. The inks are thus robust, particularly as compared with commercial conductive inks. The ink, fusing device and process are such that even with these high temperatures for fusing, the conductive paste does not offset (transfer onto the fusing apparatus such as a fuser roll).

In addition to the temperature, the fusing also subjects the cured patterned ink to pressure. The pressure may be from about 50 psi to about 1500 psi, such as about 50 psi to about 1200 psi or from about 100 psi to about 1000 psi. The temperature and pressure is desirably applied by feeding the substrate having the cured patterned ink through one or more sets of fuser rolls maintained at the necessary or desired temperature and nip pressure conditions. The feed rate through the one or more sets of fuser rolls is, for example, about 1 m/min to about 100 m/min, such as about 5 m/min to about 75 m/min or from about 5 m/min to about 60 m/min.

As the fuser rolls, any fuser roll materials may be used. For example, the top roll may be a very hard material such as steel, optionally coated with a release agent to assist in avoiding offset, and the bottom roll may be a softer roll, for example a roll coated with a rubber and the like.

In embodiments, the one of the pair of fuser rolls that contacts the printed ink may be made to include a removable release layer on a surface of the roll, such as an oil or wax, to assist in preventing offset of the printed pattern. Suitable oils are chosen from silicon oils and functionalized silicone oils. Specific examples of suitable silicone oils include, for example, polydimethylsiloxane (PDMS). Suitable functionalized oils are chosen from, for example, amino-functionalized PDMS oils and mercapto-functionalized PDMS oils.

Also, the one of the pair of fuser rolls that contacts the printed film may be made to have a surface, for example as a layer or coating, comprised of a material with good release properties. Suitable surfaces may be made of polymers such as polytetrafluoroethylene (PTFE), perfluoroalkoxy polymer resin (PFA), poly(tetrafluoroethylene-co-perfluoropropyl vinyl ether), fluorinated ethylenepropylene copolymer (FEP), copolymers of tetrafluoroethylene and hexafluoropropylene, copolymers of hexafluoropropylene and vinylidene fluoride, terpolymers of tetrafluoroethylene, vinylidene fluoride, and hexafluoropropylene, and tetrapolymers of tetrafluoroethylene, vinylidene fluoride, and hexafluoropropylene, and combinations thereof.

Figure 1:
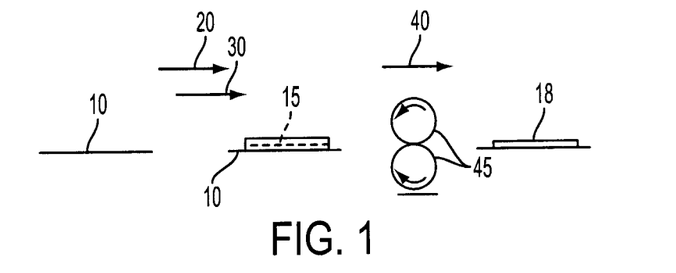
FIG. 1 is a schematic of an example process of the application.

An example process of the application is illustrated in FIG. 1. In FIG. 1, substrate 10 has a conductive paste ink printed thereon in a desired pattern in printing step 20. The printed paste ink is then cured in curing step 30, resulting in a cured printed pattern 15 on the substrate 10. The cured printed pattern on the substrate is then fed to a fusing step 40. In this step, a pair of heated fuser rolls 45 applying heat and pressure to the substrate having the cured printed pattern thereon. The end product includes substrate 10 with the fused patterned ink 18 thereon.

While the curing and fusing steps are separately described, these steps may be performed simultaneously, for example both being done in conjunction with the fusing step. In other words, the heat applied during the fusing step may also act to cure the printed ink, thereby resulting in process efficiencies. In such embodiments, the curing apparatus is within the fusing apparatus such that the apparatus should be considered one and the same.

The process of forming the patterned ink on a substrate, curing the patterned ink and fusing may be done in an inline continuous manner, or it may be done in discontinuous steps. When the ink is deposited by way of screen printing, the process is typically too time consuming to be done in an inline continuous manner. In screen printing and other discontinuous processes, the cured patterned ink on the substrate may be stored for some time between the curing and the fusing steps. That is, it is not necessary for the fusing to be done in any certain amount of time following the curing. Processes utilizing deposition methods such as offset printing and gravure/flexographic printing are conducive to use with an inline continuous process.

In the inline continuous process, the substrate material, which may be stored in roll or stacked form for easy continuous feeding through the continuous process, is first fed to the printing apparatus where the ink is printed in the predetermined desired pattern onto the substrate. The printed substrate is then continuously progressed from the printing apparatus to a curing station where heat to effect curing is applied. The item is then continuously fed on through to the fusing system where pressure and heat are applied to fuse the ink. As above, the curing and the fusing may optionally be conducted in a single step. The end product may be collected following exit from the fusing system, and subjected to further processing if needed or desired. For example, the end product may be collected on a take up roll, if appropriate, may be cut and collected, and the like. The feed rate of the materials through the process may be set to the needed speed for printing and curing, and may be the same feed rate as discussed above for the fusing feed rate.

Figure 2:
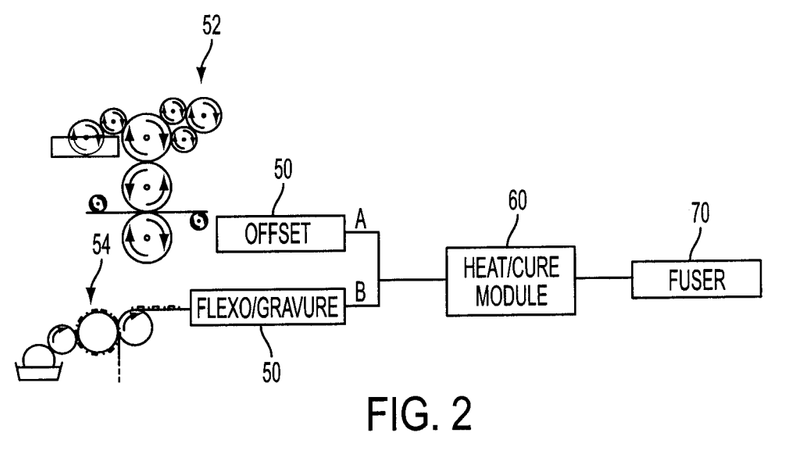
FIG. 2 is a schematic of an example continuous inline process of the application, utilizing either an offset printing process or a flexographic/gravure printing process.

An example of the inline continuous process is illustrated in FIG. 2. In FIG. 2, printing is first achieved in printing step 50. For ease of illustration, FIG. 2 illustrates two options for continuous printing, even though both options are not present in a same apparatus. In printing option A, the printing is achieved by offset printing 52. In printing option B, the printing is achieved by flexographic/gravure printing 54. In both printing options, the resulting substrate with the patterned ink printed thereon proceeds to the curing step 60 and then to the fusing step 70.

The processes described herein utilize a fusing step that is believed to impart to the patterned ink improved properties such as, for example, improved sheet resistivity and conductivity, and improved surface roughness. While not known with certainty, it is believed that the additional fusing step may improve the characteristics of the printed pattern in several respects as compared to conventionally formed printed patterns. For example, the fused printed pattern exhibits improved conductivity and reduced sheet resistivity without having to materially alter the conductive ink. This may be due to the fusing creating better contact among the conductive materials of the ink, for example by causing the conductive materials to be packed together more densely in the printed pattern and/or by removing air pocket from the printed pattern. Improved conductivity translates into cost savings because the amount of ink required for printing is reduced. Other possible benefits may include (1) a reduced surface roughness, and (2) a better adhesion of the printed pattern to the substrate. Small surface roughness is preferred for printed electronics, especially for multiple layer integration.

The fused printed patterned inks herein exhibit a significantly improved sheet resistance and conductivity compared to the same inks not subjected to the fusing procedure. For example, whereas DuPont 5025 is reported to have a sheet resistance of 12-15 mΩ/sq./mil, the present processes are able to achieve printed inks with a very low sheet resistance, for example of 10 mΩ/sq./mil or less, such as 9 mΩ/sq./mil or less. The sheet resistivities are also significantly improved, for example are decreased by 20% or more, for the same ink not subjected to the fusing procedure.

The resulting elements may be used as electrodes, conductive pads, interconnect, conductive lines, conductive tracks, and the like in electronic devices such as thin film transistors, organic light emitting diodes, RFID (radio frequency identification) tags, photovoltaic, displays, printed antenna and other electronic devices which require conductive elements or components.

The embodiments disclosed herein will now be described in detail with respect to specific exemplary embodiments thereof, it being understood that these examples are intended to be illustrative only and the embodiments disclosed herein is not intended to be limited to the materials, conditions, or process parameters recited herein. All percentages and parts are by weight unless otherwise indicated.

EXAMPLE 1

In this example, two sample inks were prepared using 2 to 5 micron silver flakes, binder and solvent. The two sample inks had the following compositions in Table 1.

TABLE 1

|  | Sample Ink 1 | | Sample Ink 2 | |
| --- | --- | --- | --- | --- |
|  | Wt % | m (g) | Wt % | m (g) |
| Silver flakes (MR-10F (Inframat)) | 75.00 | 650.25 | 75.00 | 50.03 |
| Polyvinyl pyrrolidone (55K) | — | — | 0.375 | 0.25 |
| Polyvinylbutyral (Butvar B-74) | — | — | 3.370 | 2.25 |
| Polyvinylbutyral (Butvar B-98) | 3.75 | 32.51 | — | — |
| Butyl carbitol solvent | 21.25 | 184.24 | 21.29 | 14.20 |
| TOTAL | 100.00 | 867.00 | 100.0 | 66.7 |

Note:
B-74 has a Mw of 120,000-150,000, and a Tg of 72-78° C. B-98 has a Mw of 40,000-70,000 and a Tg of 72-78° C.

The inks were prepared as follows: to a 250 mL beaker equipped with a stainless steel anchor mixing blade was added a 15 wt % solution of binder in butyl carbitol (amounts as specified in Table 1 for each ink). The mixture was heated to 55° C. with a hotplate and stirred at 500 RPM. Next, the silver flakes were added gradually to the mixture in stages to avoid lumping. The mixture was blended for 1 hour, then passed 3 times through a 3-roll-mill (Erweka model AR 400). The finished ink was isolated and transferred to an amber glass jar.

Sample inks 1 and 2, as well as a commercially available conductive ink (DuPont 5025) were coated by a doctor blade procedure with a gap of 2 mils onto a Mylar substrate. The samples were cured in an oven by heating at 120° C. for 20-30 minutes.

To measure conductivity of the deposited ink, a 2-point probe measurement was performed as follows: lines of about 100 mm length and about 2 mm width were cut into the film to test. Resistance was measured with a multimeter. Thickness of the line coating was measured in several places on the line and an average thickness was calculated. The sheet resistance is given by the following formula:

$$\text{Sheet resistance}\left[\frac{\frac{\Omega}{\text{square}}}{\text{mil}}\right] = \frac{\text{Resistance}[\Omega] * \text{Thickness[mils]}}{\text{squares number[dimensionless]}}$$

where:

$$\text{squares number} = \frac{\text{Lenght[mm]}}{\text{Width[mm]}}$$

The sheet resistivity is specific to the ink. The lower the sheet resistance value, the better the conductivity. The goal is to minimize sheet resistance.

Samples of the deposited inks were subjected to fusing. Fusing comprised pressing the coated silver ink sample through a set of heated rollers. The rollers were heated at 130° C. for the experiments. The Nip pressure was set to about 1000 psi. The top roll was made of steel while the other roll was rubber coated. In the experiments, the fusing speed was set to 1 meter/minute.

The conductivity of each sample was measured before fusing, and the "Not Fused" value is reported in Table 2. The conductivity of each sample was also measured after fusing, and the sheet resistance value is reported in the "Fused" row of Table 2.

TABLE 2

| Sample | | Repeat # | L (mm) | W (mm) | Thickness (microns (mils)) | Squares | Sheet Resistance (mΩ/square/mil) | Avg Sheet Resistance (mΩ/square/mil) and % of the initial value |
|---|---|---|---|---|---|---|---|---|
| Sample Ink 1 | Not Fused | 1 | 100 | 2.0 | 6.4 (0.26) | 50 | 13 | 12 |
| | | 2 | 100 | 2.0 | 6.2 (0.25) | 50 | 10 | |
| | | 3 | 100 | 2.0 | 6.4 (0.26) | 50 | 11 | |
| | Fused | 1 | 100 | 2.0 | 6.0 (0.24) | 50 | 8 | 8 (67%) |
| | | 2 | 100 | 2.0 | 6.3 (0.25) | 50 | 7 | |
| | | 3 | 100 | 2.2 | 6.3 (0.25) | 45 | 9 | |
| Sample Ink 2 | Not Fused | 1 | 100 | 2.0 | 11.6 (0.46) | 50 | 13 | 13 |
| | | 2 | 100 | 2.0 | 11.4 (0.46) | 50 | 12 | |
| | | 3 | 100 | 2.0 | 10.6 (0.42) | 50 | 13 | |
| | Fused | 1 | 100 | 2.0 | 11.6 (0.46) | 50 | 8 | 9 (69%) |
| | | 2 | 100 | 2.0 | 11.7 (0.47) | 50 | 8 | |
| | | 3 | 100 | 2.2 | 11.1 (0.44) | 45 | 9 | |
| DuPont 5025 | Not Fused | | | | | | | 17 |
| | Fused | | | | | | | 13 (76%) |

With all of the tested inks, including the commercially available ink, the fused pressed sample showed a significant decrease of the sheet resistance after fusing at a temperature in excess of 120° C. This translates into improved conductivity. A decrease by 33% of the initial sheet resistance was measured for the sample ink 1. These changes are significant and consistent for the samples tested. This process allows fabrication of silver coatings having very low sheet resistance, for example of 10 mΩ/sq./mil or less.

Sample ink 2 and the commercially available ink were also subjected to microscopy evaluation before and after fusing. The samples were sliced with a diamond knife and viewed in cross-section via SEM microscopy. The evaluation indicated that neither sample changed in thickness to any significantly measurable extent before and after fusing. For the commercial ink, no detectable change of the flakes packing was observed before and after fusing. For sample ink 2, the cross-sectional views indicated a more dense packing of the silver flakes after fusing than before, resulting in a larger flakes size by fusing.

It will be appreciated that various of the above-disclosed and other features and functions, or alternatives thereof, may be desirably combined into many other different systems or applications. Also, various presently unforeseen or unanticipated alternatives, modifications, variations or improvements therein may be subsequently made by those skilled in the art, and are also intended to be encompassed by the following claims.

What is claimed is:

1. A method of forming a printed pattern on a substrate, comprising depositing a conductive ink comprised of a conductive material, a thermoplastic binder and a solvent, onto the substrate to form a printed pattern, curing the printed pattern at a temperature of from 120° C. to about 140° C. for a sufficient time to remove substantially all solvent from the conductive ink, and fusing the printed pattern by feeding the substrate with the printed pattern thereon through a fusing system operated at a temperature of about 20° C. to about 130° C. above the glass transition temperature of the thermoplastic binder and subjecting the printed pattern to a temperature of at least 120° C. at a minimum to about 140° C., a pressure of from about 50 psi to about 1500 psi, and a feed rate through the fusing system of about 1 m/min to about 100 m/min;

wherein the thermoplastic binder comprises polyvinylpyrrolidone and a polyvinylbutyral terpolymer of the formula wherein $R_1$ is a chemical bond or a divalent hydrocarbon linkage having from about 1 to about 20 carbons; $R_2$ and $R_3$ are independently an alkyl group, an aromatic group or a substituted aromatic group having from about 1 to about 20 carbon atoms; x, y and z independently represent the proportion of the corresponding repeat units respectively expressed as a weight percent, wherein each repeat unit is randomly distributed along polymer chain, a sum of x, y and z is about 100 weight percent, and x is from about 3 weight percent to about 50 weight percent, y is from about 50 weight percent to about 95 weight percent, and z is from about 0.1 weight percent to about 15 weight percent, further wherein the weight ratio of polyvinylpyrrolidone to the polyvinylbutyral terpolymer is from about 1:3 to about 1:30.

2. The method of claim 1, wherein the conductive material is a conductive particulate having an average size of from about 0.5 to about 15 microns and an aspect ratio of at least about 3 to 1.

3. The method of claim 2, wherein the conductive material is silver flake having an average size of about 2 to about 10 microns.

4. The method of claim 1, wherein the fusing is at a temperature of at least about 130° C.

5. The method of claim 1, wherein the fusing further comprises simultaneously curing.

6. The method of claim 1, wherein the fusing system comprises at least one pair of heated fuser rolls.

7. The method of claim 6, wherein a fuser roll of the at least one pair that is in contact with the printed pattern includes a removable release layer on a surface thereof and/or has a surface comprised of a fluorinated material.

8. A method of forming a printed pattern on a substrate, comprising
depositing a conductive ink comprised of a conductive material, a thermoplastic binder and a solvent, onto the substrate to form a printed pattern,
curing the printed pattern at a temperature of from 120° C. to about 140° C. for a sufficient time to remove substantially all solvent from the conductive ink, and
fusing the printed pattern by feeding the substrate with the printed pattern thereon through a fusing system operated at a temperature of about 20° C. to about 100° C. above a glass transition temperature of the thermoplastic binder and subjecting the printed pattern to a temperature of at least 120° C. at a minimum to about 140° C., a pressure of from about 50 psi to about 1500 psi, and a feed rate through the fusing system of about 1 m/min to about 100 m/min, wherein the fused printed pattern has a sheet resistivity of 10 mΩ/sq./mil or less;
wherein the thermoplastic binder comprises polyvinylpyrrolidone and a polyvinylbutyral terpolymer of the formula wherein $R_1$ is a chemical bond or a divalent hydrocarbon linkage having from about 1 to about 20 carbons; $R_2$ and $R_3$ are independently an alkyl group, an aromatic group or a substituted aromatic group having from about 1 to about 20 carbon atoms; x, y and z independently represent the proportion of the corresponding repeat units respectively expressed as a weight percent, wherein each repeat unit is randomly distributed along polymer chain, a sum of x, y and z is about 100 weight percent, and x is from about 3 weight percent to about 50 weight percent, y is from about 50 weight percent to about 95 weight percent, and z is from about 0.1 weight percent to about 15 weight percent, further wherein the weight ratio of polyvinylpyrrolidone to the polyvinylbutyral terpolymer is from about 1:3 to about 1:30.

9. The method of claim 8, wherein the sheet resistivity of the fused printed pattern is decreased by at least 20% as compared to a printed pattern formed from the same conductive ink but not subjected to the fusing.

10. The method of claim 8, wherein the conductive material is silver flake having an average size of about 2 to about 10 microns.

11. A continuous method of forming a printed pattern on a substrate, comprising
in a continuous manner, feeding a substrate through a printing apparatus for printing a printed pattern onto the substrate with a conductive ink, a curing apparatus for curing the printed pattern and a fusing apparatus for fusing the cured printed pattern, the method comprising:
depositing, with the printing apparatus, the conductive ink comprising a conductive material, a thermoplastic binder and a solvent, onto the substrate to form a printed pattern, wherein the conductive material is presented in the amount of from 50 to 95 weight percent of the ink, wherein the thermoplastic binder comprises polyvinylpyrrolidone and a polyvinylbutyral terpolymer of the formula wherein $R_1$ is a chemical bond or a divalent hydrocarbon linkage having from about 1 to about 20 carbons; $R_2$ and $R_3$ are independently an alkyl group, an aromatic group or a substituted aromatic group having from about 1 to about 20 carbon atoms; x, y and z independently represent the proportion of the corresponding repeat units respectively expressed as a weight percent, wherein each repeat unit is randomly distributed along polymer chain, a sum of x, y and z is about 100 weight percent, and x is from about 3 weight percent to about 50 weight percent, y is from about 50 weight percent to about 95 weight percent, and z is from about 0.1 weight percent to about 15 weight percent, further wherein the weight ratio of polyvinylpyrrolidone to the polyvinylbutyral terpolymer is from about 1:3 to about 1:30;
curing, with the curing apparatus, the printed pattern, the curing including heating the printed pattern to a temperature of 120° C. to about 140° C. for a sufficient time to remove substantially all the solvent from the conductive ink, and
fusing, with the fusing apparatus, the printed pattern by feeding the substrate with the printed pattern thereon through a fusing system operated at a temperature of about 20° C. to about 100° C. above the glass transition temperature of the thermoplastic binder and subjecting the printed pattern to a temperature of at least 120° C. at a minimum to about 140° C., a pressure of from about 50 psi to about 1500 psi, and wherein a feed rate through the continuous method is about 1 m/min to about 100 m/min, wherein the fused printed pattern has a sheet resistivity of 10 mΩ/sq./mil or less, and further wherein the sheet resistivity of the fused printed pattern is decreased by at least 20% as compared to a printed pattern formed from the same conductive ink but not subjected to the fusing.

12. The method of claim 11, wherein the conductive material is silver flake having an average size of about 2 to about 10 microns.

13. The method of claim 11, wherein the fusing apparatus includes a curing apparatus.

14. The method of claim 1, wherein the amount of the polyvinylpyrrolidone presented in the conductive ink is from about 0.1 to about 3 weight percent of the conductive ink.

15. The method of claim 1, wherein the amount of the polyvinylpyrrolidone presented in the conductive ink is from about 0.2 to about 0.8 weight percent of the conductive ink.

16. The method of claim 1, wherein the weight ratio of polyvinylpyrrolidone to the polyvinylbutyral terpolymer is from about 1:3 to about 1:25.

17. The method of claim 1, wherein the weight ratio of polyvinylpyrrolidone to the polyvinylbutyral terpolymer is from about 1:5 to about 1:20.

* * * * *